United States Patent
Debbins et al.

(10) Patent No.: US 6,396,266 B1
(45) Date of Patent: May 28, 2002

(54) MR IMAGING SYSTEM WITH INTERACTIVE MR GEOMETRY PRESCRIPTION CONTROL

(75) Inventors: Josef P. Debbins; Richard J. Prorok, both of Waukesha; William J. Balloni, Menomonee Falls, all of WI (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/200,144

(22) Filed: Nov. 25, 1998

(51) Int. Cl.[7] .................................................. G01V 3/00

(52) U.S. Cl. ........................................ 324/307; 324/309

(58) Field of Search ................................ 324/307, 309, 324/306, 314, 312, 318, 322, 300

(56) References Cited

U.S. PATENT DOCUMENTS

| | | | |
|---|---|---|---|
| 4,830,012 A | 5/1989 | Riederer | 128/653 |
| 5,280,428 A | 1/1994 | Wu et al. | 364/413.13 |
| 5,345,176 A | 9/1994 | LeRoux et al. | 324/309 |
| 5,451,876 A | 9/1995 | Sandford et al. | 324/322 |
| 5,498,963 A | 3/1996 | Schneider et al. | 324/309 |
| 5,512,826 A | 4/1996 | Hardy et al. | 324/309 |
| 5,512,827 A | 4/1996 | Hardy et al. | 324/309 |
| 5,514,962 A | 5/1996 | Cline et al. | 324/309 |
| 5,541,513 A | 7/1996 | Maier | 324/309 |
| 5,560,361 A | 10/1996 | Glusick | 128/653.2 |
| 5,657,757 A | 8/1997 | Hurd et al. | 128/653.2 |
| 5,711,300 A | 1/1998 | Schneider et al. | 128/653.2 |
| 5,749,834 A | 5/1998 | Hushek | 600/410 |
| 5,810,729 A | 9/1998 | Hushek et al. | 600/410 |
| 6,023,653 A * | 2/2000 | Liu et al. | 324/307 |
| 6,108,573 A * | 8/2000 | Debbins et al. | 324/309 |
| 6,166,544 A * | 12/2000 | Debbins et al. | 324/309 |

FOREIGN PATENT DOCUMENTS

WO    WO 98/24058    6/1998

OTHER PUBLICATIONS

Debbins, et al. *Cardiac Magnetic Resonance Fluoroscopy.* Magnetic Resonance In Medicine, vol. 38, (1996), pp. 588–595.

Hangiandreou, et al. *Interactive Selection of Optimal Section Orientations Using Real–Time MRI.* Magnetic Resonance In Medicine, vol. 34 (1995), pp. 114–119.

Hardy, C. J. et al. *Interactive Coronary MRI.* Magnetic Resonance In Medicine, Jul. 1998, vol. 40, No. 1, pp. 105–111.

Wilman, A. H. et al. *Arterial Phase Carotid And Vertebral Artery Imaging In 3D Contrast–Enhanced MR Angiography By Combining Fluoroscopic Triggering With An Elliptical Centric Acquisition Order,* Magnetic Resonance In Medicine, Jul. 1998, vol. 40, No. 1, pp. 24–35.

* cited by examiner

Primary Examiner—Louis Arana
(74) Attorney, Agent, or Firm—Foley & Lardner; Peter J. Vogel; Michael A. Della Penna

(57) ABSTRACT

A magnetic resonance (MR) imaging system equipped with real-time imaging capability and methods of interactively prescribing geometry to excitation profiles of structure of interest, are disclosed herein. The MR imaging system includes a graphical user interface for displaying and receiving prescription commands, a display screen for displaying MR images and the graphical user interface, and an input device for inputting prescription commands. The MR imaging system allows an operator to prescribe the boundary geometry of a subsequent imaging volume and to rapidly view the prescribed boundary imaging sections prior to committing to the subsequent imaging volume acquisition. The MR imaging system also allows the operator to retrieve boundary geometry of a previously prescribed imaging volume and to rapidly view the imaging sections corresponding to the retrieved boundary geometry prior to initiating the image volume acquisition.

43 Claims, 3 Drawing Sheets

MR IMAGING SYSTEM WITH INTERACTIVE MR GEOMETRY PRESCRIPTION CONTROL

FIELD OF THE INVENTION

The present invention relates generally to magnetic resonance (MR) imaging systems and methods. More particularly, the present invention relates to a MR imaging system equipped for real-time imaging and methods for assisting the operator to interactively prescribe the geometry of the excitation profile of a structure of interest for subsequent acquisition of a MR image of the structure of interest.

BACKGROUND OF THE INVENTION

When a substance such as human tissue is subjected to a uniform magnetic field (polarizing field Bo), the individual magnetic moments of the spins in the tissue attempt to align with this polarizing field, but process about it in random order at their characteristic Larmor frequency. If the substance, or tissue, is subjected to a magnetic field (excitation field $B_1$) which is the x-y plane and which is near the Larmor frequency, the net aligned moment, $M_z$, may be rotated, or "tipped", into the x-y plane to produce a net transverse magnetic moment M. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

When attempting to define the volume of coverage of an MR imaging scan, the NMR system operator may desire to quickly view a preview MR image (such as a real-time MR image) of the anatomical section within this volume of coverage. This process can be particularly useful when prescribing a three dimensional imaging volume, in which the desired high spatial resolution requires the thinnest slab possible. It is desirable to position this thin slab such that the anatomical section within the volume of coverage is complete, i.e. for example, covers the entire desired vascular network. Thus, a quick view of each side of the slab prior to initiating the three dimensional acquisition is useful for insuring that the entire anatomical section desired is within the defined volume of coverage.

Typically, two dimensional axial, sagittal and coronal "scout" images are first acquired. Such scout images are stored for later use. To use, the operator calls up the scout image and either graphically or explicitly (using geometry coordinates) prescribes the imaging volume directly on the scout images. The imaging volume may be either a two dimensional stack of slices or a three dimensional slab of the structure of interest. The drawback of this technique is that the operator does not actually see the results of the prescribed geometry until the subsequent imaging volume is acquired. Prescription errors cannot be detected nor corrected until the imaging volume acquisition is complete. Thus, when prescription errors exist, the operator is required to re-prescribe and re-acquire the imaging volume of the desired anatomical section.

SUMMARY OF THE INVENTION

One embodiment of the invention relates to an MR imaging system having interactive MR geometry prescription control. The MR imaging system provides a method for prescribing geometry to a subsequent imaging volume of a structure of interest. The operator interactively acquires and displays a first real-time imaging section using an input device. Using the input device, the operator sets the first geometry information defining the scan plane corresponding to the first real-time imaging section in a buffer of the MR imaging system. The first geometry information prescribes the "start" boundary geometry of the subsequent imaging volume. Next, the operator interactively acquires and displays a second real-time imaging section using the input device. Similarly, the operator sets the second geometry information defining the scan plane corresponding to the second real-time imaging volume in the buffer of the MR imaging system. The second geometry information prescribes the "end" boundary geometry of the subsequent imaging volume. Henceforth, the boundary geometry defining the desired subsequent imaging volume, contain within it the desired structure of interest such as a vascular network, can be efficiently and rapidly checked and prescribed prior to initiating acquisition of the desired imaging volume.

Another embodiment of the invention relates to retrieving geometry information of a previously prescribed imaging volume. Using the input device, the operator selects a previously prescribed imaging volume and the system loads the "start" and "end" boundary geometry information corresponding to the selected previously prescribed imaging volume into the buffer. The operator can then acquire and display real-time imaging sections using the "start" and "end" boundary geometry information retrieved from the previously prescribed imaging volume. The operator typically uses a graphical user interface in conjunction with the input device and a display screen for interactively prescribing the MR geometry of excitation profiles of structures of interest.

It is an object of the present invention to provide a feature which allows the operator to utilize the speed of real-time imaging section acquisition and display thereof to accurately and efficiently prescribe the desired imaging volume boundary geometry prior to committing to the imaging volume acquisition. Another object of the present invention is to allow the operator to retrieve boundary geometry previously prescribed for an imaging volume, to rapidly view imaging sections corresponding to the retrieved boundary geometry, and to modify the boundary geometry, if necessary, prior to committing to the image volume acquisition.

Other principal features and advantages of the present invention will become apparent to those skilled in the art upon review of the following drawings, the detailed description and the appended claims.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION OF THE PREFERRED EMBODIMENTS

Figure 1:
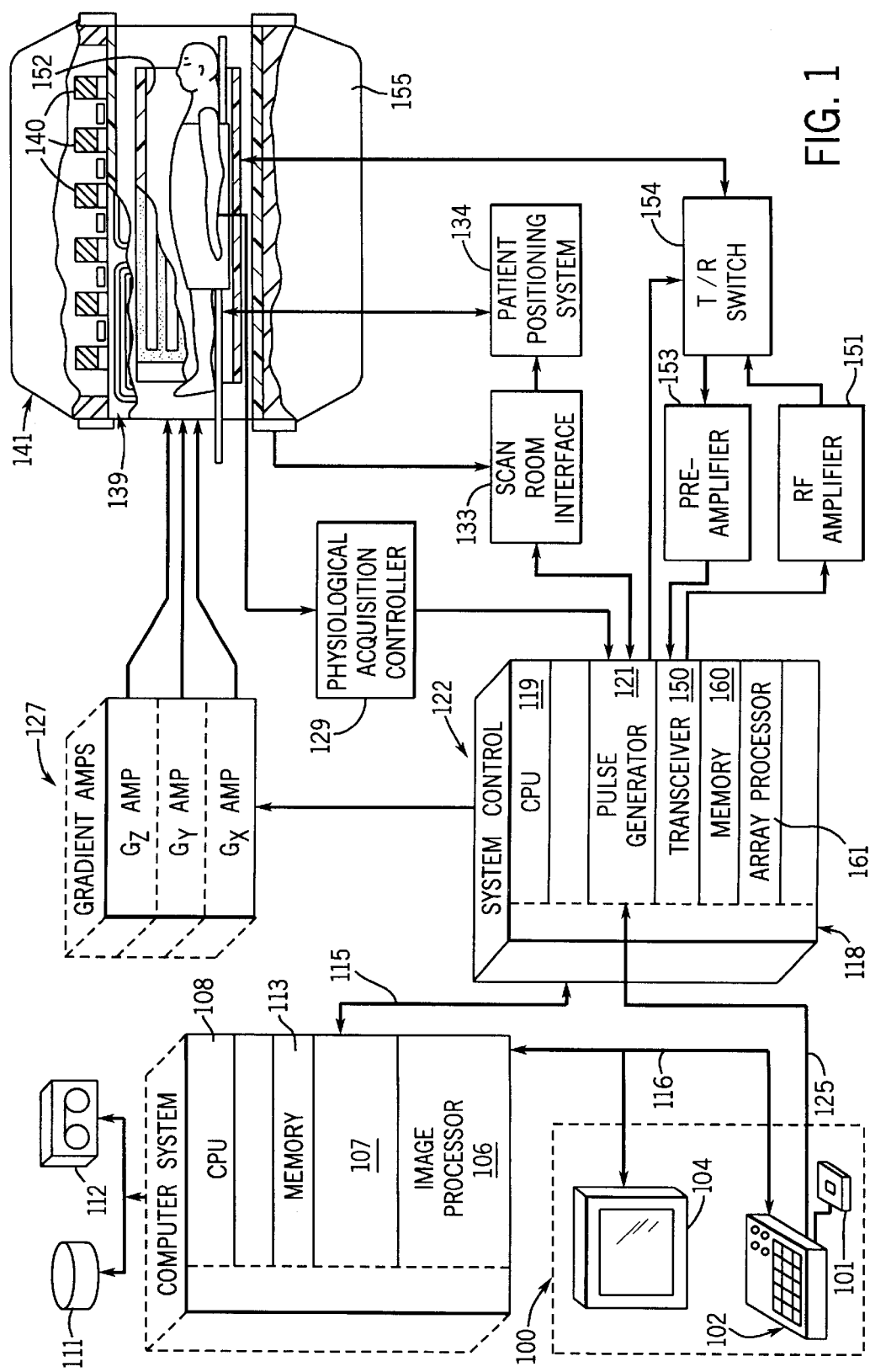
FIG. 1 is a block diagram of a MR imaging system which employs the present invention.

Referring first to FIG. 1, there is shown the major components of a preferred MR imaging system which incorporates the present invention. The operation of the system is controlled from an operator console 100 which includes an input device 101, a control panel 102 and a display 104. The console 100 communicates through a link 116 with a separate computer system 107 that enables an operator to control the production and display of images on the display 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a wholebody RF coil 152.

A transceiver module 150 in the system control 122 produces pulses which are amplified by an RF amplifier 151 and coupled to the RF coil 152 by a transmit/receiver switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
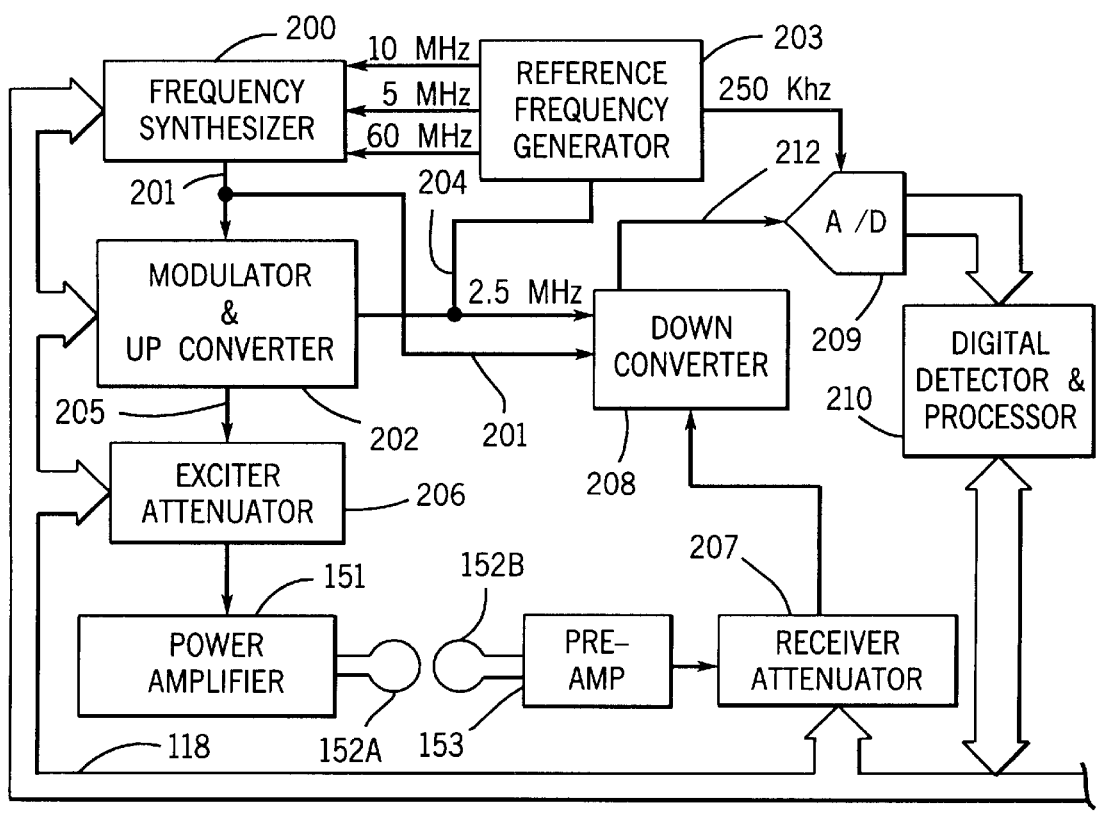
FIG. 2 is an electrical block diagram of the transceiver which forms part of the MR imaging system of FIG. 1.

Referring particularly to FIGS. 1 and 2, the transceiver 150 produces the RF excitation field $B_1$ through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16 bit in-phase (I) values and 16-bit quadrature (Q) values corresponding to the received signal. The resulting stream of digitized I and Q values of the received signal are output through backplane 118 to the memory module 160 where they are normalized in accordance with the present invention and then employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

In one embodiment of the present invention, an operator interactively prescribes geometry to define a subsequent MR imaging volume or receives geometry information from a previously defined MR imaging volume of the structure of interest, such as an anatomical structure. Such interactive geometry prescription is accomplished from the operator console 100 (also referred to as an operator interface) using the input device 101. The input device 101 is selected from a group including, but not limited to, a mouse, a joystick, a keyboard, a track ball, a touch screen, a light wand, and a voice control. The MR imaging system of the present invention is capable of imaging in any desired orientation within the structure of interest and is equipped to perform both real-time acquisitions and non real-time acquisitions. In particular, real-time refers to continuous acquisition and reconstruction of MR image data as rapidly as it is acquired. A real-time MR image can be acquired and displayed in approximately one second or less, as constrained by MR imaging system performance.

Figure 3:
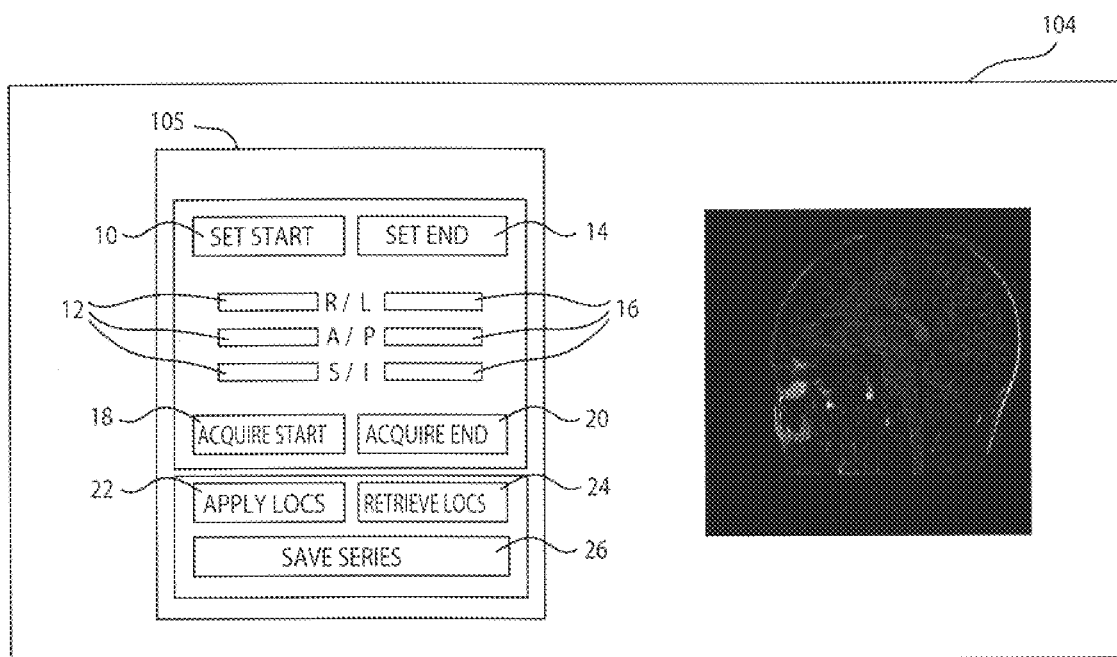
FIG. 3 is an illustration of the graphical user interface on the display screen of the operator console of the MR imaging system of FIG. 1.

FIG. 3 shows a graphical user interface 105 used in an embodiment of the present invention. The graphical user interface 105 and the MR image of the structure of interest is displayed on the display 104 (also referred to as an electronic display) of the MR imaging system. The operator interacts with the graphical user interface 105 using the input device 101. The graphical user interface 105 includes a set start boundary icon 10, a three-point start boundary geometry icon 12, a set end boundary icon 14, and a three-point end boundary geometry icon 16. The three-point start and end boundary geometry icons 12, 16, respectively, each contain geometry coordinates defining the location of a planar section of the structure of interest in the imaging volume. These coordinates are defined in the patient right-left direction (R/L), patient anterior-posterior direction (A/P), and patient superior-inferior direction (S/I), hereafter referred to as center point RAS coordinates. The graphical user interface 105 also includes an acquire start boundary icon 18, an acquire end boundary icon 20, an apply location icon 22, a retrieve location icon 24, and a save series icon 26.

First, to prescribe the boundary geometry of a subsequent or proposed imaging volume, it is desirable for the operator to view real-time imaging sections, preferably two dimensional planar sections, corresponding to the boundaries defining the desired subsequent imaging volume prior to committing to those imaging sections as the boundaries of the subsequent imaging volume. Typically the operator maneuvers the MR imaging system to acquire and display a real-time imaging section on display 104 directed to the structure of interest that defines one boundary of the desired subsequent imaging volume. The operator then registers this real-time imaging section as one boundary plane of the subsequent imaging volume by "clicking" on the set start boundary icon 10 on the graphical user interface 105. A geometry representation of the scan plane of this imaging section is determined and stored (i.e. in a text buffer) as text in center point RAS coordinates. The geometry representation of the start boundary is also displayed in the three-point start boundary geometry icon 12 of the graphical user interface 105.

Next, the operator manipulates the MR imaging system to acquire and display another real-time imaging section on display 104 directed to the structure of interest that defines another boundary of the desired subsequent imaging volume. The operator registers this current real-time imaging section as another boundary plane of the subsequent imaging volume by clicking on the set end boundary icon 14 on the graphical user interface 105. Similar to above, a geometry representation of the scan plane of this current imaging section is determined, stored, and displayed in center point RAS coordinates in the three-point end boundary geometry icon 16 of the graphical user interface 105.

It should be understood that non real-time imaging sections can also be utilized to set the start and end boundaries. The advantage of the real-time imaging sections is that the operator can very rapidly view multiple imaging sections of interest for the purposes of prescribing the subsequent imaging volume. Additionally, the operator can repeatedly set the start and/or end boundary planes by acquiring and displaying a new imaging section and then clicking on the set start boundary icon 10 or the set end boundary icon 14, as desired. In this way, the present embodiment provides the operator with a finer degree of geometry prescription control.

The remaining boundary geometry defining the subsequent imaging volume can be identical to the corresponding boundaries of the current real-time imaging section, i.e., the in-plane field of view. Alternatively, the remaining boundary geometry can be defined independently with additional icons on the graphical user interface 105 using the input device 101 (not shown in FIG. 3). Still further, in the case where the two boundary planes are not parallel to each other, the MR imaging system can apply a best fit algorithm, or other suitable algorithms, to the start and end boundaries to calculate the remaining boundary geometry.

The operator can now click on the apply location icon 22, which transfers the start and end boundary geometry information contained in icons 12, 16 to the subsequent imaging volume. Once the start and end boundary geometry information has been applied, the operator can click on the save series icon 26. This signals the MR imaging system to check for a complete boundary geometry prescription and prepares the system for acquisition of the prescribed imaging volume.

Second, to retrieve the boundary geometry of a previously prescribed or defined imaging volume and to utilize the retrieved geometry information to check the prescribed boundary geometry or to use it as a starting point from which to prescribe a subsequent imaging volume, the operator starts by selecting a previously prescribed imaging volume from a list or display of one or more previously prescribed imaging volumes on display 104 (not shown in FIG. 3). The previously prescribed imaging volumes can be, but is not limited to, previously stored real-time acquisitions, previously stored non real-time acquisitions, or previously stored graphically or explicitly (using geometry coordinates) prescribed imaging volumes from scout images. Then the operator clicks on the retrieve location icon 24 to load boundary geometry information, in center point RAS coordinates, into the buffers corresponding to icons 12, 16. Icons 12, 16 displays the two boundary plane geometry information.

Using the acquire start boundary icon 18 or the acquire end boundary icon 20, the operator commands the MR imaging system to acquire and display a real-time imaging section, typically a two-dimensional planer section, defined by the retrieved geometry information in the three-point start boundary geometry icon 12 or the three-point end boundary geometry icon 16, respectively. Alternatively, the retrieved geometry information can be used to acquire and display a non real-time imaging section. The feature embodied in the acquire start and end boundary icons 18, 20 are particularly useful for checking or previewing the boundaries of a previously prescribed imaging volume that has not been acquired, such as an imaging volume prescribed using scout images.

In another embodiment of the present invention, the imaging section acquired and displayed as a result of clicking the acquire start or end boundary icon 18, 20 can be modified such that an acquisition of a new imaging section occurs and the said section is displayed (replacing the current imaging section displayed). The modification, for example, can be accomplished by graphically or explicitly (using geometry coordinates) changing the scan plane of the currently imaging section. This new imaging section, in turn, can be utilized to replace the retrieved geometry information stored in icon 12 or 16 by clicking on the set start or end boundary icon 10 or 14, respectively. Thus, in this manner, the geometry information of a previously prescribed imaging volume can be used as a starting point from which to prescribe a subsequent imaging volume or to refine the prescription of a previously prescribed imaging volume.

It should be apparent that there has been provided in accordance with one embodiment of the present invention a method for accurately and efficiently prescribing the geometry of a subsequent imaging volume of a structure of interest using at least two two-dimensional MR imaging sections. Moreover, an embodiment of the present invention also provides a method for retrieving geometry information from a previously prescribed imaging volume and manipulating this geometry information. While the embodiments illustrated in the FIGS. and described above are presently preferred, it should be understood that these embodiments are offered by way of example only. For example, setting the start or end boundary described herein may be accomplished directly by inputting geometry coordinates rather than by displaying an imaging section and extracting or determining geometry coordinates therefrom. Accordingly, the invention is not limited to a particular embodiment, but extends to alternatives, modifications, and variations that nevertheless fall within the spirit and scope of the appended claims.

What is claimed is:

1. A method for prescribing geometry of an imaging volume of a structure of interest positioned in a magnetic resonance (MR) imaging system, comprising:
    a) selecting a first boundary plane of the structure of interest, wherein the first boundary plane is prescribed by a first imaging section of the structure of interest;
    b) determining a first geometry information corresponding to the first imaging section of the structure of interest;
    c) storing the first geometry information in the MR imaging system;
    d) selecting a second boundary plane of the structure of interest, wherein the second boundary plane is prescribed by a first imaging section of the structure of interest;
    e) determining the second geometry information corresponding to the second imaging section of the structure of interest;
    f) storing the second geometry information in the MR imaging system; and
    g) prescribing a pulse sequence to acquire at least one MR image representative of the imaging volume of the structure of interest, wherein the geometry of the imaging volume is defined by at least the first and second geometry information.

2. The method of claim 1, further comprising displaying the first and second imaging sections of the structure of interest.

3. The method of claim 1, further comprising displaying the first and second geometry information.

4. The method of claim 1, wherein at least one of the geometry information is defined in center point RAS coordinates.

5. The method of claim 1, wherein at least one of the geometry information is stored in a text buffer.

6. The method of claim 1, wherein the at least one MR image is a three-dimensional MR acquisition.

7. The method of claim 1, wherein the at least one MR image comprises a stack of a plurality of two-dimensional MR acquisitions.

8. The method of claim 1, further comprising initiating the MR imaging system to acquire the at least one MR image using the pulse sequence.

9. The method of claim 8, wherein the at least one MR image is acquired from a real-time acquisition or a non real-time acquisition.

10. The method of claim 1, wherein at least one of the imaging section is a planar section from a group including a real-time acquisition and a non real-time acquisition.

11. The method of claim 1, wherein steps (a) and (d) are performed by an input device selected from a group including a mouse, a joystick, a keyboard, a trackball, a touch screen, a light wand, and a voice control.

12. The method of claim 1, wherein the first and second boundary planes are parallel to each other.

13. The method of claim 1, wherein the geometry defining the imaging volume is further defined by an in-plane field of view of at least one imaging section.

14. The method of claim 1, wherein the geometry defining the imaging volume is further defined by a best-fit algorithm applied to the first and second boundary planes.

15. A graphical user interface for interactively prescribing geometry of an excitation profile of a structure of interest positioned in a magnetic resonance (MR) imaging system, comprising:
    a means for displaying an image of the structure of interest;
    a means for setting a start boundary;
    a means for setting an end boundary;
    a means for determining and displaying a start boundary geometry information;
    a means for determining and displaying an end boundary geometry information;
    a means for sending the start and end boundary geometry information to the MR imaging system to acquire a subsequent imaging volume of the structure of interest, wherein the boundary geometry defining the subsequent imaging volume is prescribed by the start and end boundary geometry information;
    a means for retrieving a previously defined start and end boundary geometry information from a previously defined imaging volume;
    a means for displaying the previously defined start and end boundary geometry information;
    a means for sending the previously defined start boundary geometry information to the MR imaging system to acquire and display a start imaging section, wherein the boundary geometry defining the start imaging section is obtained by the previously defined start boundary geometry information; and
    a means for sending the previously defined end boundary geometry information to the MR imaging system to acquire and display an end imaging section, wherein the boundary geometry defining the end imaging section is obtained by the previously defined end boundary geometry information.

16. The graphical user interface of claim 15 further comprising means for acquiring the subsequent imaging volume using the start and end boundary geometry information.

17. The graphical user interface of claim 15 further comprising a plurality of icons for displaying the available boundary geometry information.

18. The graphical user interface of claim 15 wherein the means for setting, the means for sending, and the means for retrieving are initiated by an input device selected from a group including a mouse, a joystick, a keyboard, a trackball, a touch screen, a light wand, and a voice control.

19. A magnetic resonance (MR) imaging system for prescribing geometry of an imaging volume of a structure of interest, comprising:
   a) means for selecting a first boundary plane of the structure of interest, wherein the first boundary plane is prescribed by a first imaging section of the structure of interest;
   b) means for determining a first geometry information corresponding to the first imaging section of the structure of interest;
   c) means for storing the first geometry information in the MR imaging system;
   d) means for selecting a second boundary plane of the structure of interest, wherein the second boundary plane is prescribed by a first imaging section of the structure of interest;
   e) means for determining the second geometry information corresponding to the second imaging section of the structure of interest;
   f) means for storing the second geometry information in the MR imaging system; and
   g) means for prescribing a pulse sequence to acquire at least one MR image representative of the imaging volume of the structure of interest, boundaries of the imaging volume being defined by the first and second geometry information.

20. The system of claim 19, further comprising means for displaying the first and second imaging sections-of the structure of interest.

21. The system of claim 19, further comprising means for displaying the first and second geometry information.

22. The system of claim 19, wherein at least one of the geometry information is defined in center point RAS coordinates.

23. The system of claim 19, wherein at least one of the geometry information is stored in a text buffer.

24. The system of claim 19, wherein the at least one MR image is a three-dimensional MR acquisition.

25. The system of claim 19, wherein the at least one MR image is comprised of a stack of a plurality of two-dimensional MR acquisitions.

26. The system of claim 19, further comprising means for initiating the MR imaging system to acquire the at least one MR image using the first and second geometry information.

27. The system of claim 26, wherein the at least one MR image is acquired from a real-time acquisition or a non real-time acquisition.

28. The system of claim 19, wherein at least one of the imaging section is a planar section from a group including a real-time acquisition and a non real-time acquisition.

29. The system of claim 19, wherein at least one of the means for selecting are performed by an input device selected from a group including a mouse, a joystick, a keyboard, a trackball, a touch screen, a light wand, and a voice control.

30. The system of claim 19, wherein the first and second boundary planes are parallel to each other.

31. The system of claim 19, wherein remaining boundaries defining the imaging volume are prescribed by an in-plane field of view of at least one imaging section.

32. The system of claim 19, wherein remaining boundaries defining the imaging volume are prescribed by a best-fit algorithm applied to the first and second boundary planes.

33. A magnetic resonance (MR) imaging system for prescribing geometry of an imaging volume of a structure of interest, comprising:
   a MR imaging device configured to acquire and display in real-time at least a first MR image and a second MR image of the structure of interest, the first and second MR images representative of different locations within the structure of interest;
   an operator interface configured to transmit at least one selection signal in response to an operator selecting a first boundary plane of the structure of interest on the operator interface and the operator selecting a second boundary plane of the structure of interest on the operator interface, wherein the first and second boundary planes are selected relative to the first and second MR images, respectively; and
   a computer system coupled to the operator interface, wherein the computer system is configured to determine a first and second geometry information corresponding to the first and second boundary planes, respectively, of the structure of interest, in response to the at least one selection signal, the computer system is configured to store the first and second geometry information in the MR imaging system, and the first and second geometry information represent at least a part of the geometry defining the imaging volume.

34. The system of claim 33, wherein the operator interface includes an electronic display configured to display the first and second imaging sections of the structure of interest.

35. The system of claim 33, wherein the operator interface includes an electronic display configured to display the first and second geometry information.

36. The system of claim 33, wherein the imaging volume is represented by a three-dimensional MR acquisition or a stack of a plurality of two-dimensional MR acquisitions.

37. The system of claim 33, further comprising a system control configured to receive an initiation signal from the operator interface to initiate the acquisition of at least one MR image representative of the imaging volume using the boundary geometry prescribed by the first and second geometry information.

38. The system of claim 37, wherein the at least one MR image is acquired from a group including a real-time acquisition and a non real-time acquisition.

39. The system of claim 35, wherein at least one of the first and second MR images is a planar section from a group including a real-time acquisition and a non real-time acquisition.

40. The system of claim 33, wherein the operator interface includes an input device selected from a group including a mouse, a joystick, a keyboard, a trackball, a touch screen, a light wand, and a voice control.

41. The system of claim 33, wherein the first and second boundary planes are parallel to each other.

42. The system of claim 33, wherein the geometry defining the imaging volume is prescribed by an in-plane field of view associated with the first or second MR image.

43. The system of claim 33, wherein the geometry defining the imaging volume is prescribed by a best-fit algorithm applied to the first and second boundary planes.

* * * * *

UNITED STATES PATENT AND TRADEMARK OFFICE
CERTIFICATE OF CORRECTION

PATENT NO. : 6,396,266 B1
DATED : May 28, 2002
INVENTOR(S) : Josef P. Debbins, Richard J. Prorok and William J. Balloni It is certified that error appears in the above-identified patent and that said Letters Patent is hereby corrected as shown below:

Column 6,
Line 52, delete "displays" and substitute -- display --.

Column 9,
Line 39, delete "sections-of" and substitute -- sections of --;

Column 10,
Line 51, delete "35" and substitute -- 33 --.

Signed and Sealed this

Fifteenth Day of October, 2002

Attest:

JAMES E. ROGAN
Attesting Officer   Director of the United States Patent and Trademark Office